United States Patent [19]
Shih et al.

[11] Patent Number: 5,891,792
[45] Date of Patent: Apr. 6, 1999

[54] ESD DEVICE PROTECTION STRUCTURE AND PROCESS WITH HIGH TILT ANGLE GE IMPLANT

[75] Inventors: Jiaw-Ren Shih; Jian-Hsing Lee, both of Hsin-Chu, Taiwan

[73] Assignee: Taiwan Semiconductor Manufacturing Company, Ltd., Hsin-Chu, Taiwan

[21] Appl. No.: 133,968

[22] Filed: Aug. 14, 1998

[51] Int. Cl.[6] ........................................... G03C 1/77
[52] U.S. Cl. .............................. 138/525; 438/24; 438/41; 438/31; 257/263; 257/360; 257/361; 257/404
[58] Field of Search ..................................... 257/360, 361, 257/347, 404, 616; 438/355, 366, 368, 219

[56] References Cited

U.S. PATENT DOCUMENTS

| 5,063,168 | 11/1991 | Vora | 437/31 |
|---|---|---|---|
| 5,312,766 | 5/1994 | Aronowitz et al. | 437/24 |
| 5,360,749 | 11/1994 | Anjum et al. | 437/24 |
| 5,413,969 | 5/1995 | Huang | 437/200 |
| 5,496,751 | 3/1996 | Wei et al. | 437/4 |
| 5,623,156 | 4/1997 | Watt | 257/355 |
| 5,714,777 | 2/1998 | Ismail et al. | 257/263 |
| 5,750,435 | 5/1998 | Pan | 438/525 |

*Primary Examiner*—Donald L. Monin, Jr.
*Assistant Examiner*—Dwayne L. Bentley
*Attorney, Agent, or Firm*—George O. Saile; Stephen B. Ackerman; William J. Stoffel

[57] ABSTRACT

A structure and method for fabricating an ESD device for FET transistors by forming a silicon germanium region 40 under a channel region 44 of a field effect transistor (FET). The silicon germanium region 40 comprises the base of a parasitic bipolar 200 transistor that increases the turn on speed. The method comprises:

a) forming a gate dielectric layer 20 over a substrate 10;
  b) forming a gate 30 over the gate 30; the substrate having a channel region under the gate; the channel region extending from the surface of the substrate to a channel depth below the substrate surface;
  c) forming a silicon germanium region 40 under the channel region 44 using a tilt angle ion implant of Germanium ions;
  d) forming source and drain doped regions 50 70 adjacent to the channel region and the silicon germanium region whereby the silicon germanium region comprises a base of a parasitic bipolar transistor 40.

27 Claims, 3 Drawing Sheets

ESD DEVICE PROTECTION STRUCTURE AND PROCESS WITH HIGH TILT ANGLE GE IMPLANT

BACKGROUND OF INVENTION

1) Field of the Invention

This invention relates generally to fabrication of Semiconductor devices having Electro Static Discharge (ESD) circuits and more particularly to a Ge implant process to improve the performance of Electro Static Discharge (ESD) transistors.

2) Description of the Prior Art

In current processes, the Electro Static Discharge (ESD) device often uses the snapback characteristics of parasitic bipolar of NMOS transistor to carry away the high current pulse. Because of the p-well, the emitter injection efficiency is low. So the ESD device can not have high performance, especially for deep sub-micron devices with higher p-well concentrations which will degrade the current gain.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,413,969 (Huang): *Differential treatment to selectively avoid silicide formation on ESD I/O transistors in a salicide process*—shows a Ge implant into S/D regions in a silicide process for ESD. Selective salicidation of source/drain regions of a transistor is accomplished by Ge I/I a first subset of the source/drain regions to hinder formation of metal-silicide over the first subset of the source/drain regions. See col. 4, line 63.

U.S. Pat. No. 5,496,751 (Wei) *Method of forming an ESD and hot carrier resistant integrated circuit structure*—shows a method of forming a ESD device using LATID I/I processes.

U.S. Pat. No. 5,360,749 (Anjum)—*Method of making semiconductor structure with germanium implant for reducing short channel effects and subthreshold current near the substrate surface*—shows a method of tilt angle I/I Ge into S/D regions and in a portion of the channel. The semiconductor structure is adapted to receive non-perpendicular implant of germanium in the juncture between the channel and the source/drain regions as well as in the juncture between field oxide channel stop implant and source/drain regions.

U.S. Pat. No. 5,312,766 (Aronowitz) *Method of providing lower contact resistance in MOS transistors*—shows Ge implanted immediately on the substrate surface of a FET.

SUMMARY OF THE INVENTION

It is an object of the present invention to provide a method for fabricating a Electro Static Discharge (ESD) circuit forming a Si Ge buried region 40 under the gate that improves the emitter efficiency and current gain of the parasitic bipolar in NMOS for ESD protection.

It is an object of the present invention to provide a method for fabricating a Electro Static Discharge (ESD) circuit using a Ge & As (or P) I/I under a channel region.

To accomplish the above objectives, the present invention provides a structure and a method of manufacturing an ESD device for field effect transistors. See FIGS. 4a and 4B. The ESD device has a parasitic bipolar transistor 200 (see FIG. 4a) with a base comprised of a novel silicon germanium region 40. The novel silicon germanium region 40 lowers the resistance to turn on the bipolar transistor 200.

The invention forms the silicon germanium region 40 using a Ge ion implant. The present invention provides a method of fabricating an ESD device for FET transistors by forming a silicon germanium layer 40 under a channel region 44 of the field effect transistors (FET); comprising the steps of:

a) See FIG. 1—forming a gate dielectric layer 20 over a substrate 10; the substrate having a substrate surface;

b) forming a gate 30 over the gate 30; the substrate having a channel region under the gate; the channel region extending from the surface of the substrate to a channel depth below the substrate surface; whereby the channel region 44 is a region where electrons and holes travel between the source/drain regions 70 during the operation of the field effect transistor;

c) forming a silicon germanium region 40 under the gate and under the entire the channel region 44 using a tilt angle ion implant of Germanium ions; the silicon germanium region 40 having a germanium concentration peak density at a first depth below the substrate surface; the first depth is greater than the channel depth;

d) forming LDD regions 50 in the substrate adjacent to the gate 30 and vertically above the silicon germanium region 40;

e) forming spacers 60 on the sidewalls of the gate 30;

f) forming Source/Drain regions 70 adjacent to the spacers in the substrate and adjacent to the channel region 60; 70.

The structure of the invention's ESD device can be summarized as follows a) a gate dielectric layer 20 over a substrate 10; the substrate having a surface;

b) a gate 30 over the gate dielectric layer; the gate having sidewalls the substrate having a channel region under the gate; the channel region extending from the surface of the substrate to a channel depth below the substrate surface;

c) a silicon germanium region 40 under the gate and under the channel region 44; the silicon germanium region 40 having a concentration peak density of a first depth below the substrate surface; the first depth is greater than the channel depth;

d) LDD regions 50 in the substrate adjacent to the gate 30 and above the silicon germanium region 40;

e) spacers 60 on the sidewalls of the gate 30;

f) Source/Drain regions 70 adjacent to the spacers 60 in the substrate; the silicon germanium region laterally between the source/drain regions 70.

The invention's Ge Si region 40 improves the transistor performance. The mobility is improved with the invention's $Ge_xSi_{1-x}$ region 40 i.e., $\mu_n(Ge)/\mu_n(Si)=3.7$, $\mu_p(Ge)/\mu_p(Si)=3.0$.

The invention provides the following benefits:
Turns on the parasitic Bipolar NMOS TX 200 more quickly (See FIGS. 4A and 4B). For the parasitic NPN Bipolar Tx 200, the base is formed by the $Si_xGe_{1-x}$ regions 40. Because of the higher mobility ($\mu$) of the $Si_xGe_{1-x}$ regions 40 (base), the bipolar Tx 200 turn on speed is faster.
Improves the uniformity of current flow—See FIGS. 4A, 4B and 5. In conventional processes without the invention's $Si_xGe_{1-x}$ region 40, only one parasitic bipolar turns on due to the p-well resistance effect. For the invention, the $Si_xGe_{1-x}$ improves the mobility and reduces the resistance. The invention's reduced resistance increases the chances of turning on more parasitic NPN bipolar transistors (Tx) thus with more uniform current flow.

reducing the local temperature overheating—The temperature is reduced because the quick turn on bipolar 200 has smaller resistance that reduces the power dissipation.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of fabrication a ESD circuit involving a Ge high tilt angel I/I to form a $Si_xGe_{1-x}$ layer 40 that is doped with N-type impurities under the channel region 44 of a field effect transistor (FET).

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

Figure 1:
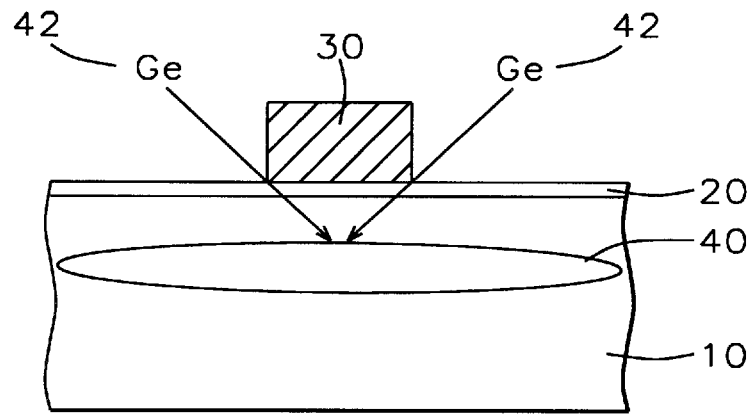
FIGS. 1 through 3 are cross sectional views for illustrating a method for manufacturing a ESD circuit according to the present invention.
Figure 2:
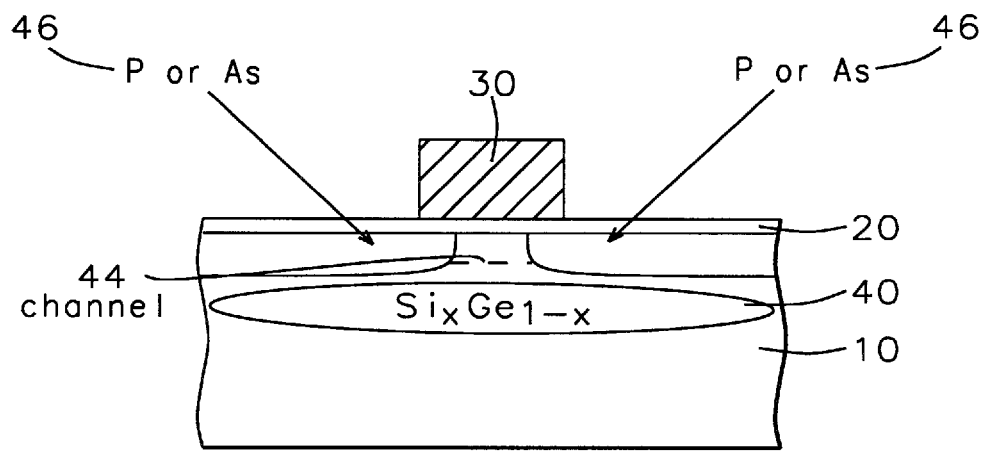

As shown in FIG. 1 a gate dielectric layer 20 is formed over a substrate 10. The substrate has a surface. The gate dielectric layer is preferably comprised of silicon oxide and preferably has a thickness in a range of between about 25 and 250 Å.

The substrate can contain a p-well (not shown) under the gate, source, drain and surrounding areas shown in FIG. 1. The p-well preferably have a p-type impurity concentration in a range of between about 5E16 and 5E18 atoms/cm$^3$.

A channel region 44 resides within the substrate below the gate 30 to a depth less than a depth of subsequently formed LLD regions 50. The channel region is a term of art. The channel region is the region where electrons and hole travel between the Source and drains 70 during the normal operation of a MOS transistor. It is important to note that the channel region 44 is distinct (physically separated and electrically functionally different) from the invention's silicon germanium $Si_xGe_{1-x}$ region 40 and from the Parasitic bipolar transistor 200 shown in FIG. 4.

Next, a gate 30 is formed over the gate 30. The gate is preferably formed of polysilicon, doped polysilicon, or a polycide.

Invention's Silicon Germanium Region 40—Base Of Parasitic Bipolar 200

As shown in FIG. 1, a silicon germanium region ($Si_xGe_{x-1}$) 40 is formed under the gate using a high tilt angle ion implant (I/I) of Germanium ions. The tilt angle implant is an implant performed at non-perpendicular angle relative to the substrate. The $Si_xGe_{1-x}$ region 40 is located under and/or laterally between the subsequently formed S/D regions 70 and LDD regions 50.

It is important to note that the invention's silicon germanium layer is under the channel region 44 and does not overlap the channel region. This is in contrast with the known prior art that implants germanium ions into the channel region or at the substrate surface.

The high tilt angle ion implant of Ge ions preferably comprises implanting the Ge ions at a dose between 5E14 and 5E156 atoms/cm$^3$, at an energy between 250 Kev and 500 Kev. The exact implant dose and energy depend on the geometry of the device.

The $Si_xGe_{1-x}$ region 40 is preferably annealed. The anneal can be done immediately after the Ge implant or more preferably is performed after the LDD implant.

Next, lightly doped source and drain regions (LDD) regions 50 in the substrate adjacent to the gate 30 and above the silicon germanium region ($Si_xGe_{x-1}$) 40.

The LLD regions can be formed before or after the silicon germanium regions.

In the claims, the term "source and drain doped regions" can comprise both LDD regions 50 and source/drain regions 70.

After the anneals (see FIG. 3), the LDD regions 50 having a width in a range of between about 500 and 1500 Å; +5E17 and a concentration in a range of between about 5E19 atoms/cm$^3$.

Spacers 60 are formed on the sidewalls of the gate 30. The spacers 60 preferably having a width in a range of between about 1000 and 2500 Å.

Next, Source/Drain regions 70 are formed adjacent to the LDD regions 50 and the silicon germanium region (N-$Si_xGe_{x-1}$) 40.

The Source/Drain regions 70 are preferably formed by an As ion implant at a dose of between about 2E20 and 2E21 atoms/cm$^3$ and a energy of between about 40 Kev and 80 Kev.

Figure 3:
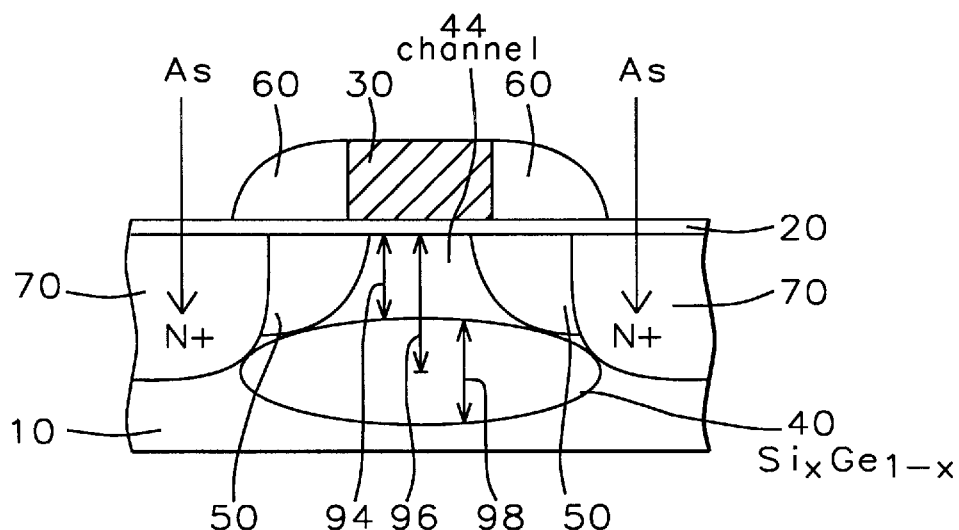

FIG. 3 shows the FET and silicon germanium region 40 after the anneals. The $Si_xGe_{1-x}$ region 40 preferably begins at depth 94 in a range of between about 500 and 1500 Å below the substrate surface. The silicon germanium region ($Si_xGe_{x-1}$) 40 preferably have a germanium concentration peak density of a first depth below the substrate surface. The first depth is greater than the channel depth. That is the $Si_xGe_{1-x}$ layer is under the channel. The silicon germanium region 40 has the Germanium concentration peak between about 2E20 and 2E21 atoms/cm$^3$ and the Germanium concentration peak density at a depth 96 below the surface substrate between about 2500 and 3000 Å. The silicon germanium region preferably has a vertical thickness 98 in a range of between about 2000 and 4000 Å.

Figure 4A:
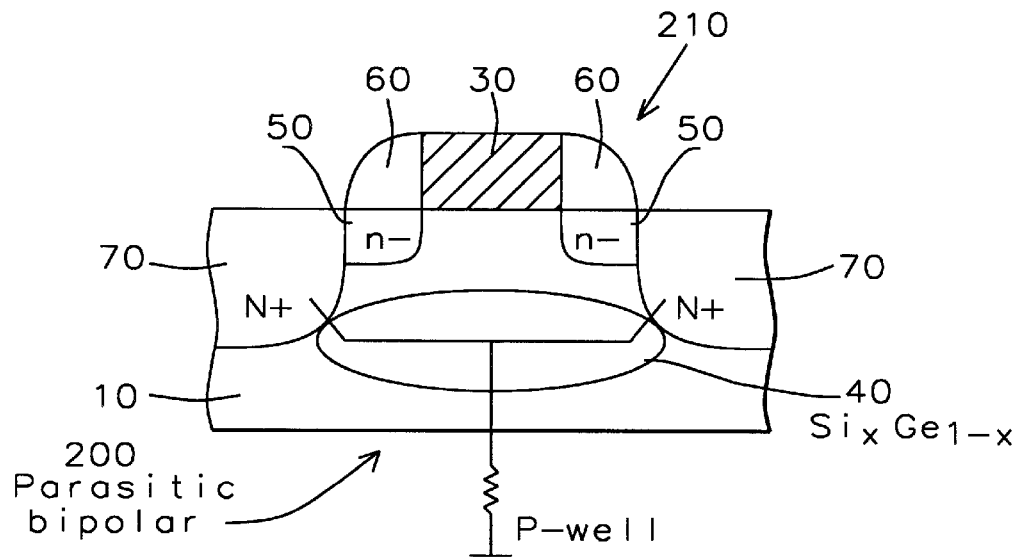
FIG. 4A shows a cross sectional view of a ESD transistor and a schematic of an ESD circuit showing the invention's mechanism for improving ESD performance.
Figure 4B:
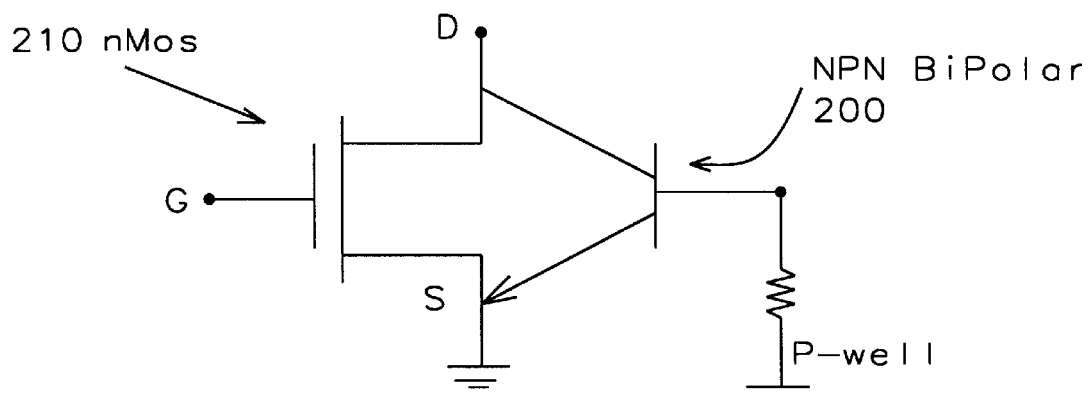
FIG. 4B is a schematic diagram of the invention's high performance NPN Bipolar transistor 200 and the nMOS FET transistor.

FIG. 4b shows the parasitic bipolar transistor 200 where the source/drains 70 are the emitter and base of the bipolar Tx 200 and the invention's $Si_xGe_{1-x}$ region is the base of the bipolar 200.

Figure 5:
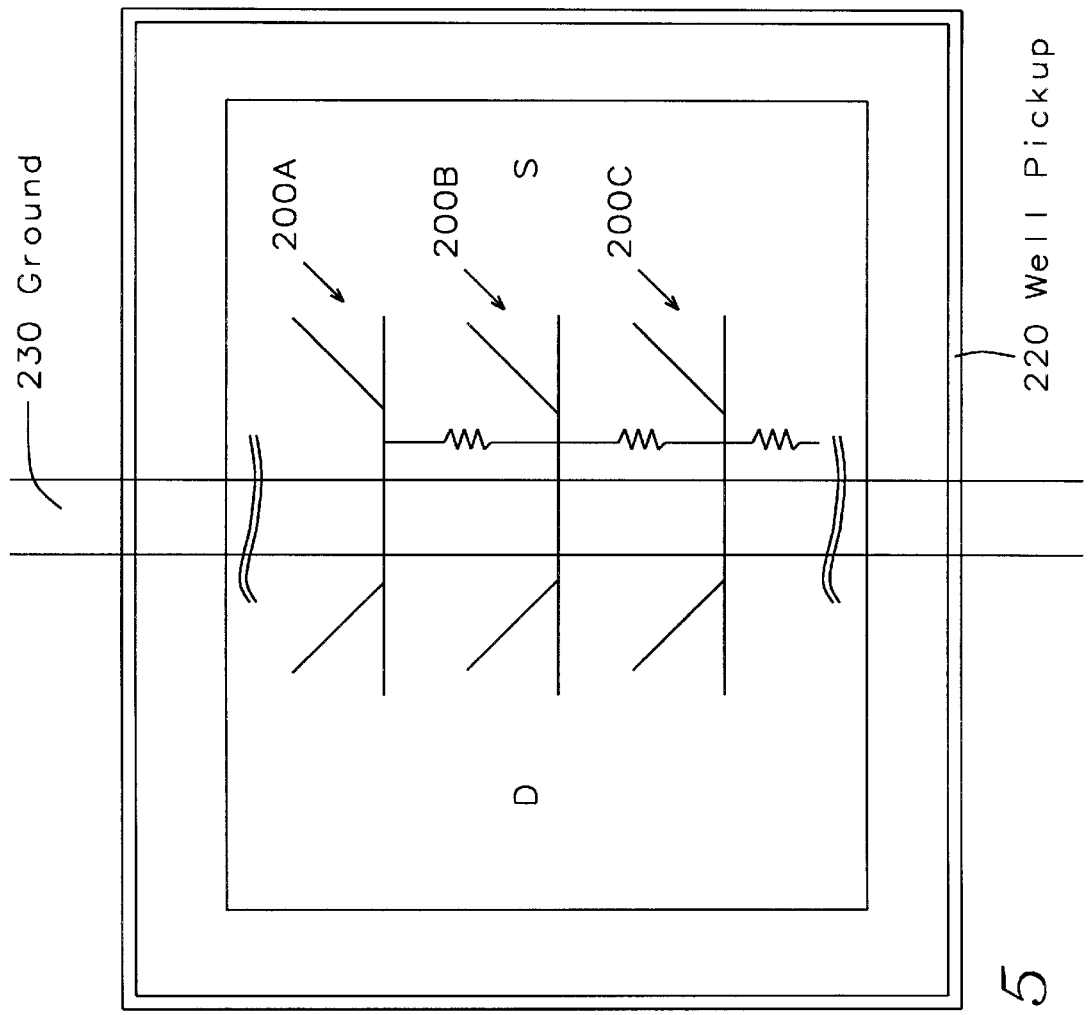
FIG. 5 is a diagram of several bipolar transistors 200A 200B 200C in an array showing the invention's low resistance $Si_xGe_{1-x}$ regions 40 turning on several transistors according to the structure and method of the invention.

FIG. 5 is a diagram of several bipolar transistors 200A 200B 200C in an array showing the invention's low resistance $Si_xGe_{1-x}$ regions 40 turning on several transistors. The ground 230 is connected to the bipolar transistors and a well pick up 220 surrounds the transistors 200. The $Si_xGe_{1-x}$ region 40 reduces the base resistance of the bipolar transistors and therefor allows more bipolar transistors to turn on under ESD conditions.

Structure of the ESD device with $Si_xGe_{1-x}$ base region 40

The invention's structure of the ESD device is described as follows. A ESD device having a silicon germanium layer 40 under a channel region of a field effect transistor (FET) and a parasitic bipolar transistor; comprising:

a) a gate dielectric layer 20 over a substrate 10; the substrate having a surface;

b) a gate 30 over the gate dielectric layer; the gate having sidewalls the substrate having a channel region under the gate; the channel region extending from the surface of the substrate to a channel depth below the substrate surface;

c) a silicon germanium region 40 under the gate and under the channel region 44; the silicon germanium region 40 having a concentration peak density of a first depth below the substrate surface; the first depth is greater than the channel depth;

d) LDD regions 50 in the substrate adjacent to the gate 30 and above the silicon germanium region 40;

e) spacers 60 on the sidewalls of the gate 30;

f) Source/Drain regions 70 adjacent to the spacers 60 in the substrate; the silicon germanium region laterally between the source/drain regions 70; the source and drain regions 70 having a peak concentration of a third depth.

Invention's Silicon Germanium Bipolar Base Region 40—Contrast With Prior Art It is important to note that the invention's $Si_xGe_{1-x}$ region 40 is not located on or very near the substrate surface and does not reduce contact S/D resistance. In contrast to U.S. Pat. No. 5,312,766 (Aronowitz), the invention's is not intended, and does not reduce the contact resistance.

Also, in contrast to U.S. Pat. No. 5,360,749 (Anjum et al.), the invention's $Si_xGe_{1-x}$ region 40 is not located directly entirely under the Source/Drain regions and extends under across the entire the entire channel region. Moreover, Anjum's Ge implant is at a much lower dose and energy that the invention's Ge implant. (Anjum=dose 1E12 cm$^{-2}$ vs Invention's dose=5e15 cm$^{-2}$ and I/I energy for Anjum=6 Kev vs invention=300 Kev). The invention's Ge implant forms a $Si_xGe_{1-x}$ region 40 that enhances the parasitic bipolar turn on speed that improves the ESD performance.

BENEFITS OF THE INVENTION

As shown in FIG. 4, the invention's $Si_xGe_{1-x}$ region 54B improves the performance of the ESD circuit in snap back mode. When the ESD under ESD zapping goes into snapback regions, in the meantime the parasitic bipolar 200 with high mobility 40 can turn on more quickly, so it can improve the performance of the ESD circuit.

The invention's $Si_xGe_{1-x}$ regions 40 improve the performance of an ESD circuit in snap back mode by (1) High mobility (2) low resistance and (3) high emitter injection efficiency.

Both PMOS and NMOS devices can be formed using the $Si_xGe_{1-x}$ Implant process of the invention.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an ESD device for FET transistors forming a silicon germanium layer under a channel region of a field effect transistor (FET); comprising the steps of:

a) forming a gate dielectric layer over a substrate; said substrate having a substrate surface;

b) forming a gate over said gate dielectric layer; said substrate having a channel region under said gate; said channel region extending from said surface of said substrate to a channel depth below said substrate surface; said gate having sidewalls;

c) forming a silicon germanium region under said channel region using a tilt angle ion implant of Germanium ions;

d) forming source and drain doped regions adjacent to said channel region and said silicon germanium region whereby said silicon germanium region comprised a base of a parasitic bipolar transistor of said ESD device.

2. The method of claim 1 wherein said channel region is a region where electrons and holes travel between said source and drain regions during the operation of said field effect transistor.

3. The method of claim 1 wherein said channel region resides within said substrate under said channel region and extends to a depth less than said silicon germanium region.

4. The method of claim 1 wherein said tilt angle ion implant of Germanium ions comprises implanting said Germanium ions at a dose between about 5E14 and 5E16 atoms/cm$^3$, and at an energy between about 250 Kev and 500 Kev.

5. The method of claim 1 wherein said silicon germanium region ($Si_xGe_{x-1}$) having a germanium concentration peak density of a first depth below said substrate surface; said first depth is greater than said channel depth; said silicon germanium region has said Germanium concentration peak between about 2E20 and 2E21 atoms/cm$^3$ and said Germanium concentration peak density at a depth below said surface substrate between about 2500 and 3000 Å and said silicon germanium region has a vertical thickness in a range of between about 2000 and 4000 Å.

6. The method of claim 1 wherein said source and drain doped regions comprise LDD regions and source/drain regions.

7. The method of claim 1 wherein said source and drain doped regions comprise LDD regions and source/drain regions and step (d) further comprises:
 a) forming LDD regions in said substrate adjacent to said gate and to a depth in substrate above said silicon germanium region;
 b) forming spacers on said sidewalls of said gate;
 c) forming Source/Drain regions adjacent to said spacers in said substrate.

8. The method of claim 1 wherein said source and drain doped regions comprise LDD regions and source/drain regions and step (d) further comprises:
 a) forming LDD regions in said substrate adjacent to said gate and to a depth in substrate above said silicon germanium region; said channel region resides within said substrate under said gate and said channel region begins at a depth less than a depth of said LLD regions; said LDD region having a thickness in a range of between about 500 and 1500 Å; and a concentration in a range of between about 5E17 and 5E19 atoms/cm$^3$;
 b) forming spacers on said sidewalls of said gate;
 c) forming Source/Drain regions adjacent to said spacers; said silicon germanium region laterally between said source/drain regions; said source and drain region having a peak concentration of a third depth; said depth of said concentration peak of said silicon germanium region is greater than said depth of said concentration peak of said source/drain regions and said silicon germanium region is located between said source/drain regions and under said LLD regions.

9. A method of fabricating an ESD device for FET transistors forming a silicon germanium layer under a channel region of a field effect transistor (FET); comprising the steps of:
 a) forming a gate dielectric layer over a substrate; said substrate having a substrate surface;
 b) forming a gate over said gate; said substrate having a channel region under said gate; said channel region extending from said surface of said substrate to a channel depth below substrate surface; whereby said channel region is a region where electrons and holes travel between said source /drain regions during the operation of said field effect transistor;
 c) forming a silicon germanium region under said gate and under the entire said channel region using a tilt angle ion implant of Germanium ions; said silicon germanium region having a germanium concentration peak density at a first depth below said substrate surface; said first depth is greater than said channel depth;
 d) forming LDD regions in said substrate adjacent to said gate and vertically above said silicon germanium region;
 e) forming spacers on said sidewalls of said gate;
 f) forming Source/Drain regions adjacent to said spacers in said substrate and adjacent to said channel region; said source/drain regions having a peak concentration of a third depth.

10. The method of claim 9 wherein said tilt angle ion implant of Germanium ions comprises implanting the Germanium ions at a dose between about 5E14 and 5E16 atoms/cm$^3$, and at an energy between about 250 Kev and 500 Kev.

11. The method of claim 9 wherein said silicon germanium region has a Germanium concentration between about 2E20 and 2E21 atoms/cm$^3$ and has a Germanium concentration peak density at a depth below the surface of the substrate between about 2500 and 3000 Å and said silicon germanium region has a thickness in a range of between about 2000 and 4000 Å.

12. The method of claim 9 wherein said channel region resides within said substrate under said gate to a depth less than a depth of said LLD regions.

13. The method of claim 9 wherein said LDD region having a thickness in a range of between about 500 and 1500 Å; and a concentration in a range of between about 5E17 and 5E19 atoms/cm$^3$.

14. The method of claim 9 wherein said spacers having a width in a range of between about 1000 and 2500 Å.

15. The method of claim 9 wherein said Source/Drain regions are formed by an Arsenic ion implant at a dose of between about 2E20 and 2E21 atoms/cm$^3$ and a energy of between about 40 and 80 Kev.

16. The method of claim 9 wherein said depth of said concentration peak of said silicon germanium region is greater than said depth of said concentration peak of said source/drain regions and said silicon germanium region 40 is laterally located between said source/drain regions and under said LLD regions 50.

17. The method of claim 9 wherein said silicon germanium region in step (c) is formed after said LLD regions in step (d).

18. An ESD device for FET transistors having a parasitic bipolar with a silicon germanium layer under a channel region of a field effect transistor (FET); comprising:
 a) a gate dielectric layer over a substrate; said substrate having a substrate surface;
 b) a gate over said gate dielectric layer; said substrate having a channel region under said gate; said channel region extending from said substrate surface to a channel depth below said substrate surface; said gate having sidewalls;
 c) a silicon germanium region under said gate and under said channel region; said silicon germanium region having a germanium concentration peak density of a first depth below said substrate surface; said first depth is greater than said channel depth;
 d) source and drain doped regions adjacent to said channel region and said silicon germanium region; whereby said silicon germanium forms a base of a parasitic bipolar transistor.

19. The ESD device of claim 18 wherein said source and drain doped region comprise LDD regions and source/drain regions;
 and said LDD regions reside in said substrate adjacent to said gate and above said silicon germanium region; and spacers on said sidewalls of said gate;
 said Source/Drain regions adjacent to said spacers; said silicon germanium region laterally between said source/drain regions; said source and drain region having a peak concentration of a third depth.

20. The ESD device of claim 18 wherein Said silicon germanium region has a Germanium Peak concentration between about 2E20 and 2E21 atoms/cm$^3$ and has a Germanium concentration peak density at a depth below the surface of the substrate between about 2500 and 3000 Å; and said silicon germanium region has a vertical thickness in a range of between about 2000 and 4000 Å.

21. A ESD device having a silicon germanium layer 40 under a channel region of a field effect transistor (FET) and a parasitic bipolar transistor; comprising:

a) a gate dielectric layer over a substrate; said substrate having a surface;

b) a gate over said gate dielectric layer; said gate having sidewalls said substrate having a channel region under said gate; said channel region extending from said surface of said substrate to a channel depth below said substrate surface;

c) a silicon germanium region under said gate and under said channel region; said silicon germanium region having a concentration peak density of a first depth below said substrate surface; said first depth is greater than said channel depth;

d) LDD regions in said substrate adjacent to said gate and above said silicon germanium region;

e) spacers on said sidewalls of said gate;

f) Source/Drain regions adjacent to said spacers in said substrate; said silicon germanium region laterally between said source/drain regions; said source and drain regions having a peak concentration of a third depth.

22. The ESD device of claim 21 wherein said channel region resides within said substrate under said gate to a depth less than a depth of said LLD regions.

23. The ESD device of claim 21 wherein said LDD region having a thickness in a range of between about 500 and 1500 Å; and a concentration in a range of between about 5E17 and 5E19 atoms/cm$^3$.

24. The ESD device of claim 21 wherein said spacers having a width in a range of between about 1000 and 2500 Å.

25. The ESD device of claim 21 wherein said depth of said concentration peak of said silicon germanium region is greater than said depth of said concentration peak of said source/drain regions and said silicon germanium region is located between said source/drain regions and under said LLD regions.

26. The ESD device of claim 21 wherein said channel region 44 is where electrons and holes travel between said source and drain regions during the operation of said field effect transistor.

27. The ESD device of claim 21 wherein said silicon germanium region ($Si_xGe_{x-1}$) 40 has a Germanium Peak concentration between about 2E20 and 2E21 atoms/cm$^3$ and had a Germanium concentration peak density at a depth below the surface of the substrate between about 2500 and 3000 Å and said silicon germanium layer has a thickness in a range of between about 2000 and 4000 Å.

* * * * *